(12) United States Patent
Lin

(10) Patent No.: US 6,548,393 B1
(45) Date of Patent: *Apr. 15, 2003

(54) SEMICONDUCTOR CHIP ASSEMBLY WITH HARDENED CONNECTION JOINT

(76) Inventor: Charles W. C. Lin, 34 Pinewood Grove, Singapore 738290 (SG)

(*) Notice: Subject to any disclaimer, the term of this patent is extended or adjusted under 35 U.S.C. 154(b) by 0 days.

This patent is subject to a terminal disclaimer.

(21) Appl. No.: 09/927,216

(22) Filed: Aug. 10, 2001

Related U.S. Application Data

(63) Continuation-in-part of application No. 09/878,626, filed on Jun. 11, 2001, which is a continuation-in-part of application No. 09/687,619, filed on Oct. 13, 2000.

(51) Int. Cl.$^7$ .............................................. H01L 21/44
(52) U.S. Cl. ..................... 438/618; 438/622; 438/637; 438/666; 438/693; 257/693; 257/778
(58) Field of Search ................................ 438/618, 622, 438/637, 666; 257/693, 778

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |

(List continued on next page.)

FOREIGN PATENT DOCUMENTS

| | | | |
|---|---|---|---|
| EP | 0 718 882 A1 | 6/1996 | H01L/23/057 |
| WO | WO 97/38563 | 10/1997 | H05K/1/03 |
| WO | WO 99/57762 | 11/1999 | H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Clip Bumping Supplier—Technology an IC Package contractor should look for," Advanced Packaging, Mar./Apr. 1998, pp. 70–73.

(List continued on next page.)

*Primary Examiner*—David Nelms
*Assistant Examiner*—Reneé R. Berry
(74) *Attorney, Agent, or Firm*—David M. Sigmond

(57) ABSTRACT

A semiconductor chip assembly includes a semiconductor chip, a conductive trace, an insulative adhesive and a hardened connection joint. The conductive trace includes first and second opposing surfaces and a peripheral sidewall between the surfaces, the first surface faces away from the pad and the peripheral sidewall overlaps the pad. The adhesive is between the second surface and the pad. The connection joint contacts the first surface, the peripheral sidewall and the pad, extends between the peripheral sidewall and the pad and electrically connects the conductive trace and the pad. Preferably, the connection joint is reflowed solder or cured conductive adhesive. A method of manufacturing the assembly includes disposing the adhesive between the conductive trace and the pad, then etching the adhesive thereby exposing the pad, then depositing a non-solidified material on the first surface, the peripheral sidewall and the pad, and then transforming the non-solidified material into the connection joint.

70 Claims, 17 Drawing Sheets

U.S. PATENT DOCUMENTS

| | | | |
|---|---|---|---|
| 5,172,851 A | 12/1992 | Matsushita et al. | 28/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 25/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/717 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/66 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 6/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,403,460 B1 * | 8/2000 | Lin | 438/618 |
| 6,127,204 A | 10/2000 | Isaacs et al. | 438/106 |

OTHER PUBLICATIONS

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U. S. application Ser. No. 09/465,024, filed Dec. 16, 1999, entitled "Bumpless Flip Chip Assembly With Solder Via".

U. S. application Ser. No. 09/464,562, filed Dec. 16, 1999, entitled "Bumpless Flip Clip Assembly With Strips and Via–Fill".

U. S. application Ser. No. 09/464,561, filed Dec. 16, 1999, entitled "Bumpless Flip Chip Assembly With Strips–In–Via And Plating".

U.S. application Ser. No. 09/120,408, filed Jul. 22, 1998, entitled "Flip Chip Assembly With Via Interconnection".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,213, filed Aug. 22, 2000, entitled "Method of Making a Support Circuit for a Semiconductor Chip Assembly".

U.S. application Ser. No. 09/643,445, filed Aug. 22, 2000, entitled "Method of Making a Semiconductor Chip Assembly".

U.S. application Ser. No. 09/665,928, filed Sep. 20, 2000, entitled "Semiconductor Chip Assembly With Ball Bond Connection Joint".

U.S. application Ser. No. 09/665,931, filed Sep. 20, 2000, entitled "Method of Making a Support Circuit With a Tapered Through–Hole for a Semiconductor Chip Assembly".

U.S. application Ser. No. 09/677,207, filed Oct. 2, 2000, entitled "Method of Making a Semiconductor Chip Assembly With a Conductive Trace Subtractively Formed Before and After Chip Attachment".

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly with Simultaneously Electrolessly Plated Contact Terminal and Connection Joint".

U.S. application Ser. No. 09/864773, filed May 24, 2001, entitled "Semiconductor Chip Assembly With Ball Bond Connection Joint".

* cited by examiner

SEMICONDUCTOR CHIP ASSEMBLY WITH HARDENED CONNECTION JOINT

CROSS-REFERENCE TO RELATED APPLICATIONS

This application is a continuation-in-part of U.S. application Ser. No. 09/878,626 filed Jun. 11, 2001, which is a continuation-in-part of U.S. application Ser. No. 09/687,619 filed Oct. 13, 2000, each of which is incorporated by reference.

BACKGROUND OF THE INVENTION

1. Field of the Invention

The present invention relates to a semiconductor chip assembly, and more particularly to a method of mechanically and electrically connecting a conductive trace to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost.

Other techniques besides wire bonding, TAB and flip-chip technologies have been developed to provide connection joints that electrically connect pads on chips to external conductive traces. These connection joints can be formed by electroplated metal, electrolessly plated metal, solder or conductive adhesive.

Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates on the cathode surface. Electroplating using AC current has also been developed. Electroplating is relatively fast and easy to control. However, a plating bus is needed to supply current where electroplating is desired. The plating bus creates design constraints and must be removed after the electroplating occurs. Non-uniform plating may arise at the bottom of relatively deep through-holes due to poor current density distribution. Furthermore, the electrolytic bath is relatively expensive.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus. However, electroless plating is relatively slow. Furthermore, the electroless bath is relatively expensive.

Solder joints are relatively inexpensive, but exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies.

Conductive adhesive joints with conductive fillers in polymer binders are relatively inexpensive, but do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

Accordingly, each of these connection joint techniques has various advantages and disadvantages. The optimal approach for a given application depends on design, reliability and cost considerations.

In view of the various development stages and limitations in currently available semiconductor chip assemblies, there is a need for a semiconductor chip assembly that is cost-effective, manufacturable and makes advantageous use of solder or conductive adhesive connection joints.

SUMMARY OF THE INVENTION

An object of the present invention is to provide a semiconductor chip assembly with a chip, a conductive trace and a connection joint that includes solder or conductive adhesive.

Another objective of the present invention is to provide a convenient, cost-effective method for manufacturing semiconductor chip assemblies as chip scale packages, chip size packages, ball grid arrays or other structures.

In accordance with one aspect of the invention, a semiconductor chip assembly includes a semiconductor chip, a conductive trace, an insulative adhesive and a hardened connection joint. The conductive trace includes first and second opposing surfaces and a peripheral sidewall between the surfaces, the first surface faces away from the pad and the peripheral sidewall overlaps the pad. The adhesive is between the second surface and the pad. The connection joint contacts the first surface, the peripheral sidewall and the pad, extends between the peripheral sidewall and the pad and electrically connects the conductive trace and the pad.

Preferably, the connection joint is composed of solder or conductive adhesive.

It is also preferred that the connection joint is the only electrical conductor external to the chip that contacts the pad, the connection joint and the adhesive are the only materials external to the chip that contact the pad, and the connection joint and the adhesive are the only materials that contact both the conductive trace and the pad.

It is also preferred that the conductive trace includes a second peripheral sidewall opposite the peripheral sidewall, the second peripheral sidewall overlaps the pad, and the connection joint contacts the second peripheral sidewall and extends between the second peripheral sidewall and the pad.

In accordance with another aspect of the invention, a method of manufacturing the assembly includes disposing the adhesive between the conductive trace and the pad, then etching the adhesive thereby exposing the pad, then depositing a non-solidified material on the first surface, the peripheral sidewall and the pad, and then transforming the non-solidified material into the connection joint.

Preferably, the non-solidified material includes solder and applying the energy reflows the solder, or alternatively, the non-solidified material includes conductive adhesive and applying the energy cures the conductive adhesive.

It is also preferred that etching the adhesive includes applying a laser that ablates the adhesive.

An advantage of the present invention is that the semiconductor chip assembly makes advantageous use of a hardened connection joint such as reflowed solder or cured conductive adhesive. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly is well-suited for low cost consumer electronics.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
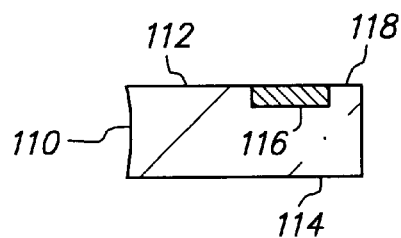
FIGS. 1A–1L are cross-sectional views showing a method of connecting a conductive trace to a semiconductor chip in accordance with an embodiment of the present invention.
Figure 2A:
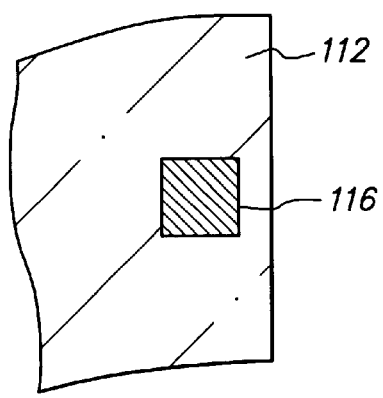
FIGS. 2A–2L are top plan views corresponding to FIGS. 1A–1L, respectively.
Figure 3A:
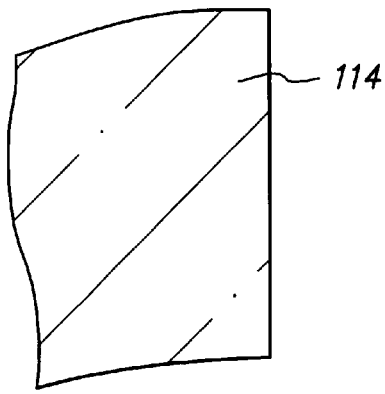
FIGS. 3A–3L are bottom plan views corresponding to FIGS. 1A–1L, respectively.
Figure 1B:
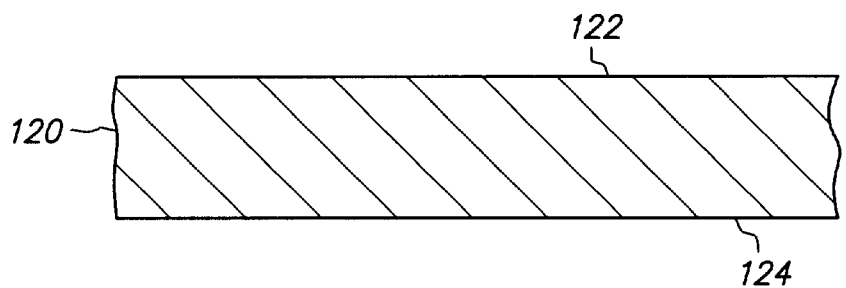
Figure 2B:
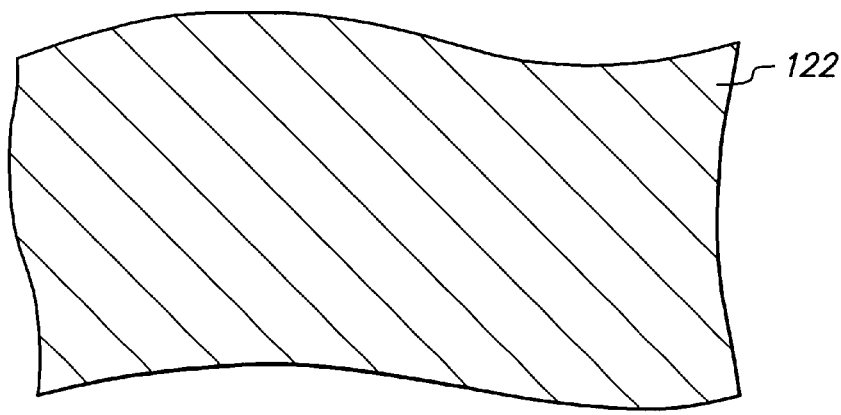
Figure 3B:
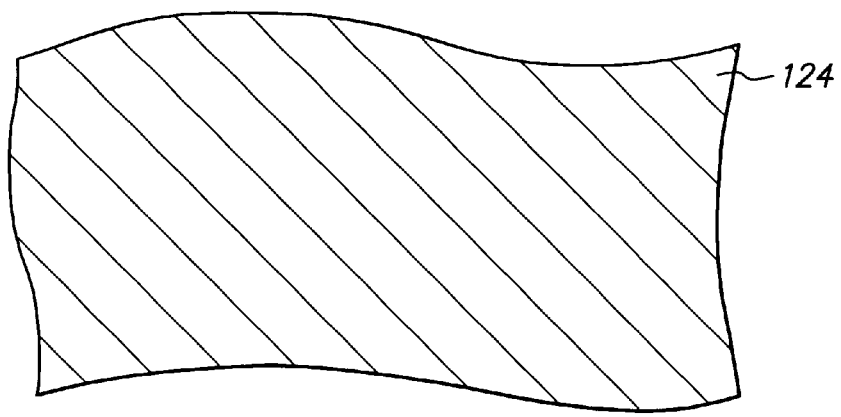
Figure 1C:
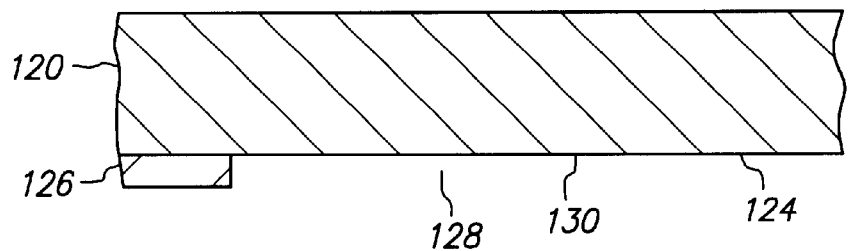
Figure 2C:
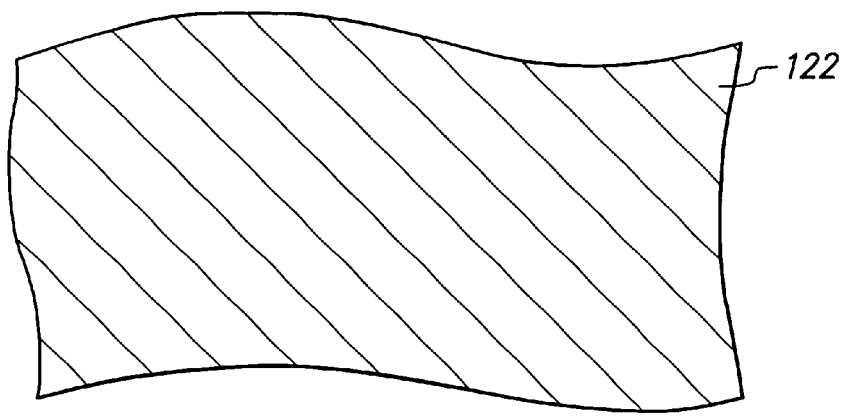
Figure 3C:
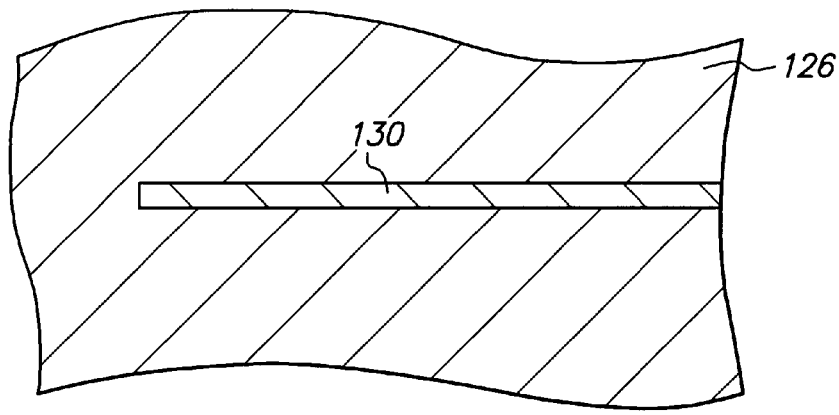
Figure 1D:
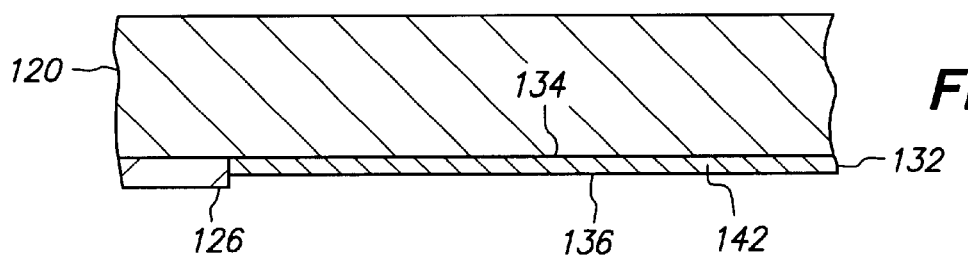
Figure 2D:
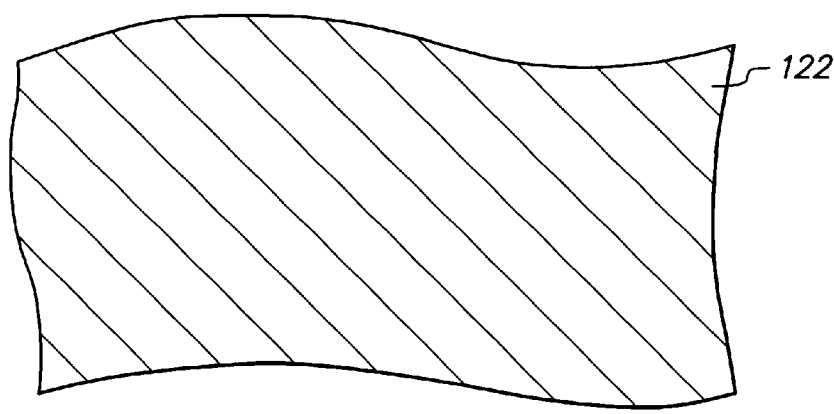
Figure 3D:
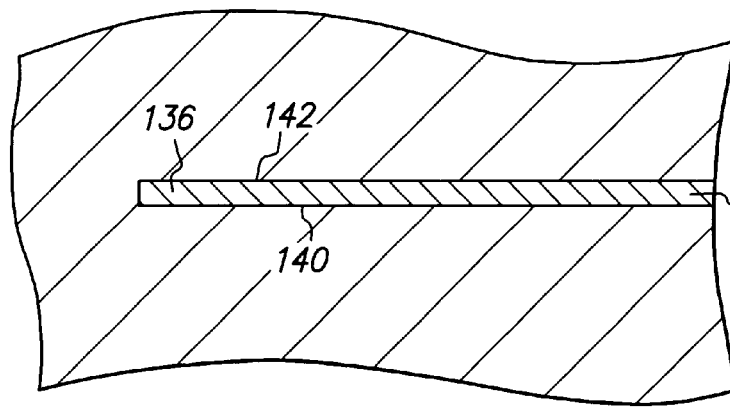
Figure 1E:
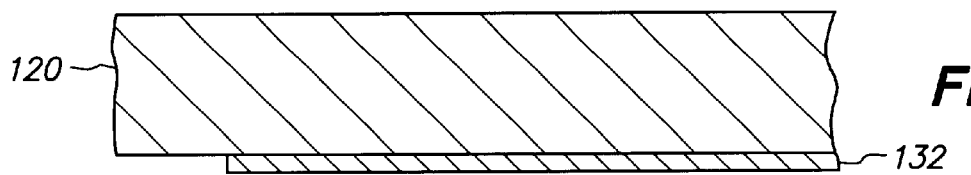
Figure 2E:
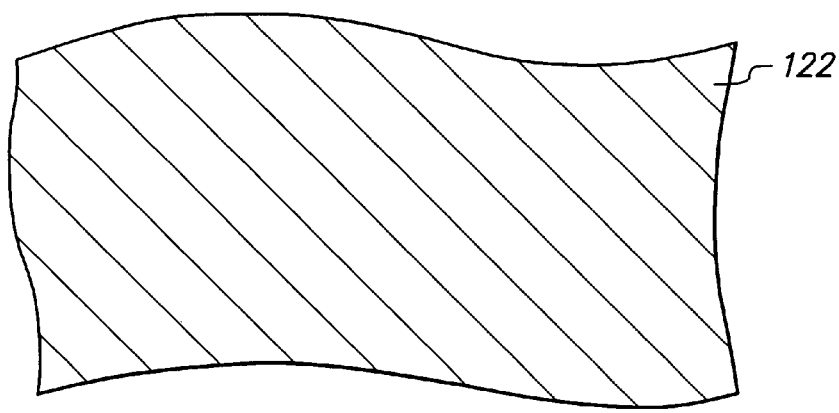
Figure 3E:
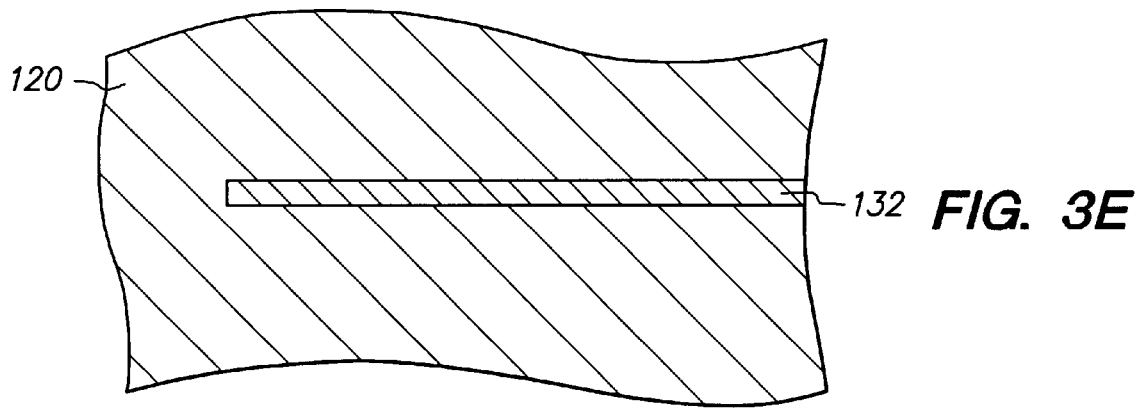
Figure 1F:
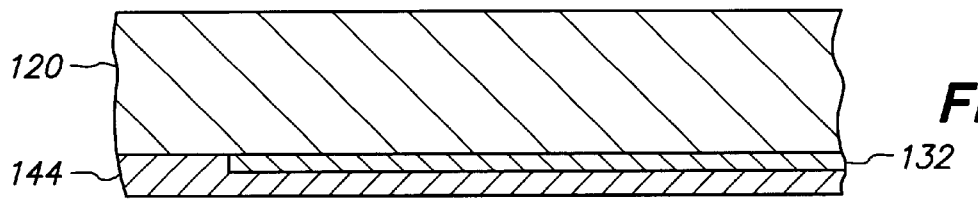
Figure 2F:
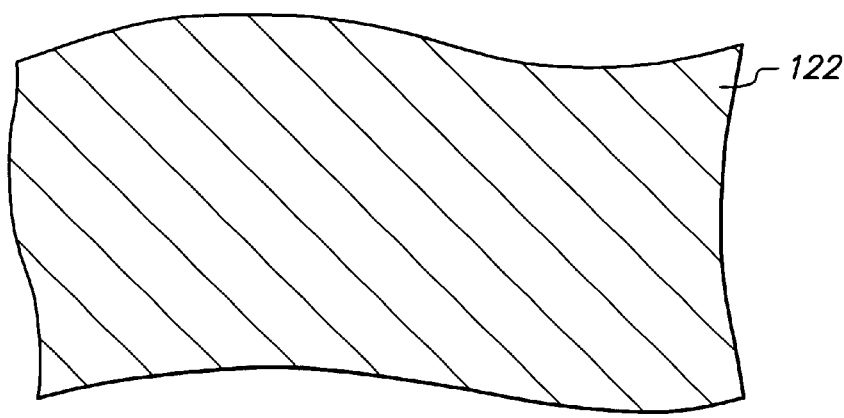
Figure 3F:
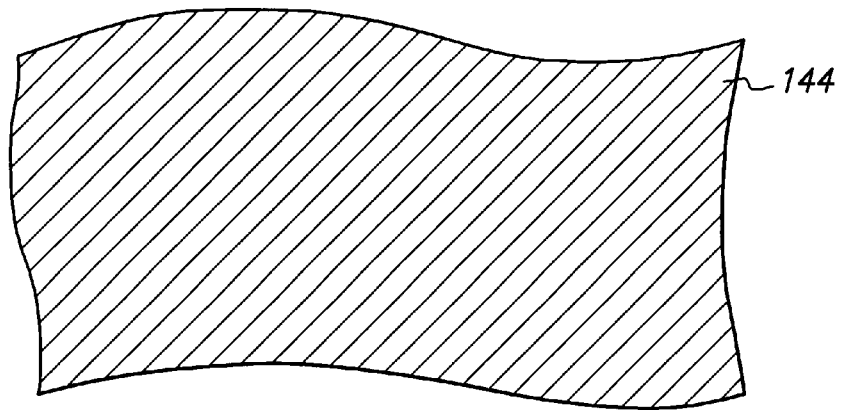
Figure 1G:
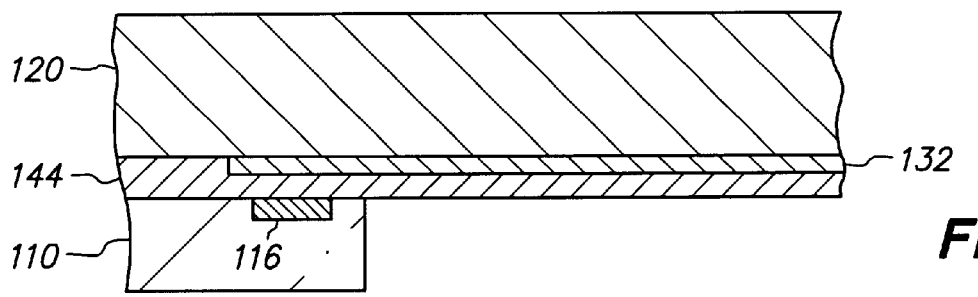
Figure 2G:
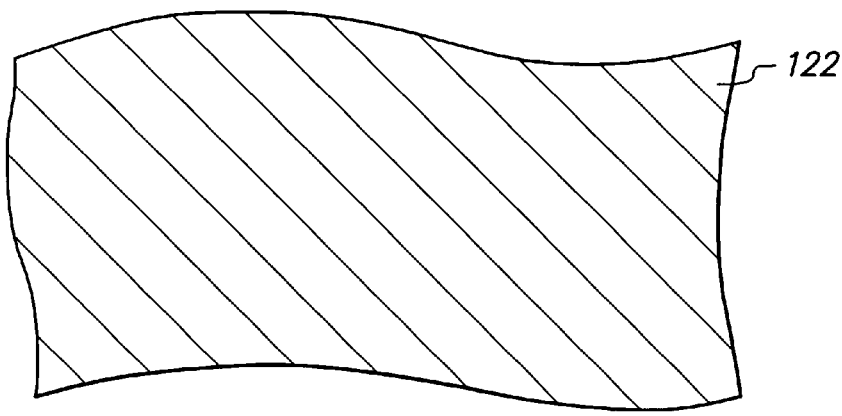
Figure 3G:
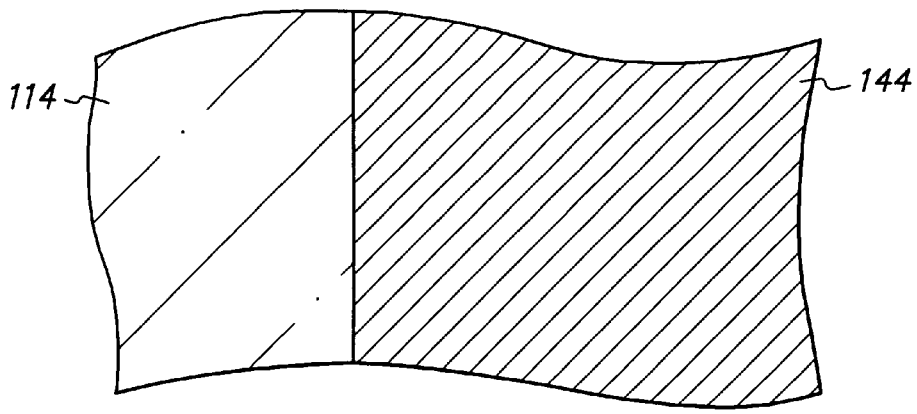
Figure 1H:
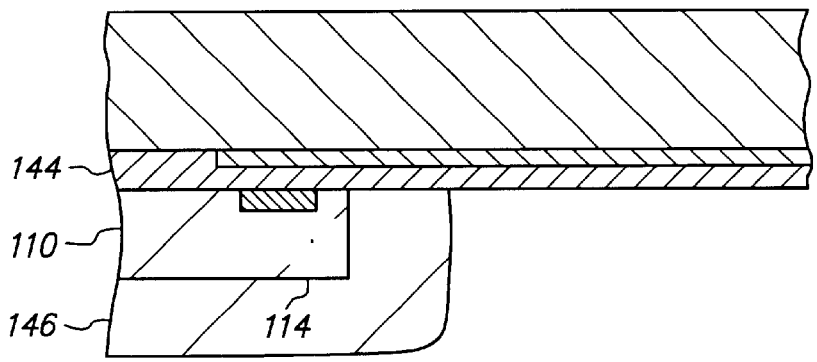
Figure 2H:
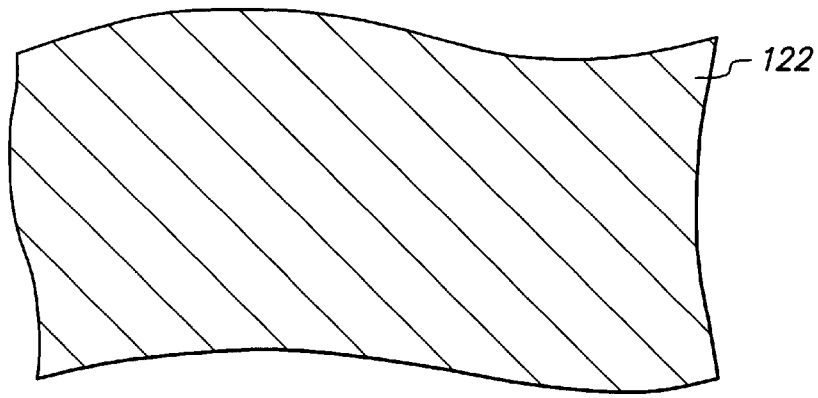
Figure 3H:
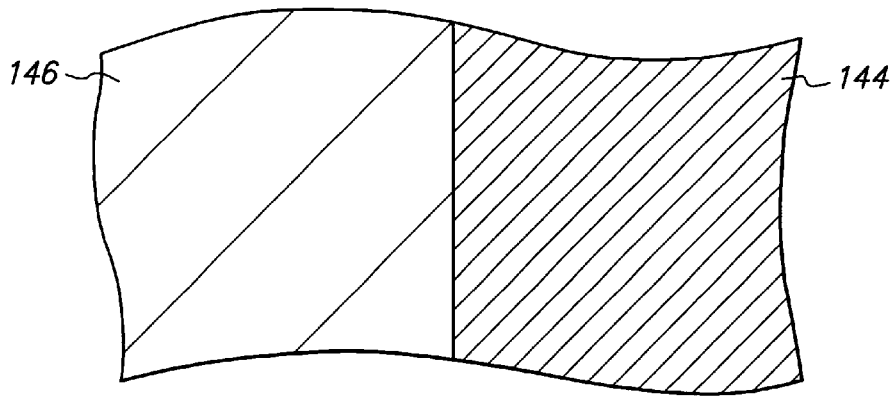
Figure 1I:
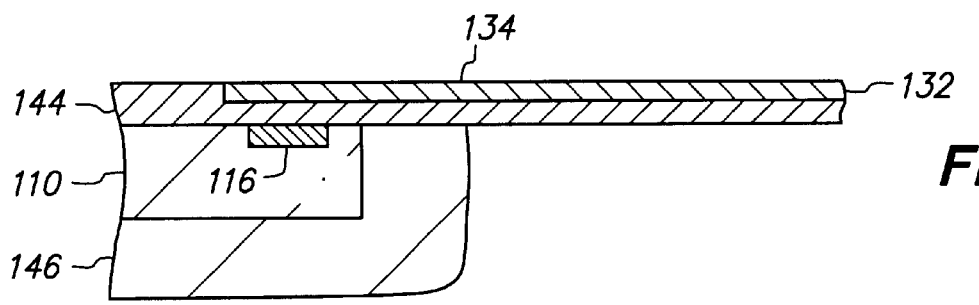
Figure 2I:
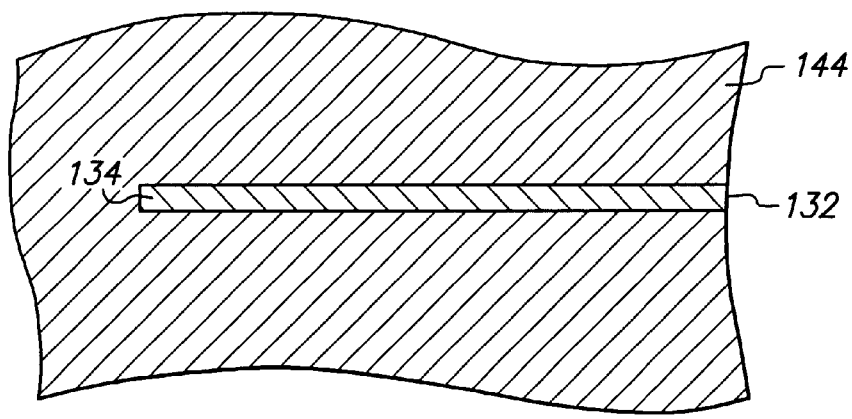
Figure 3I:
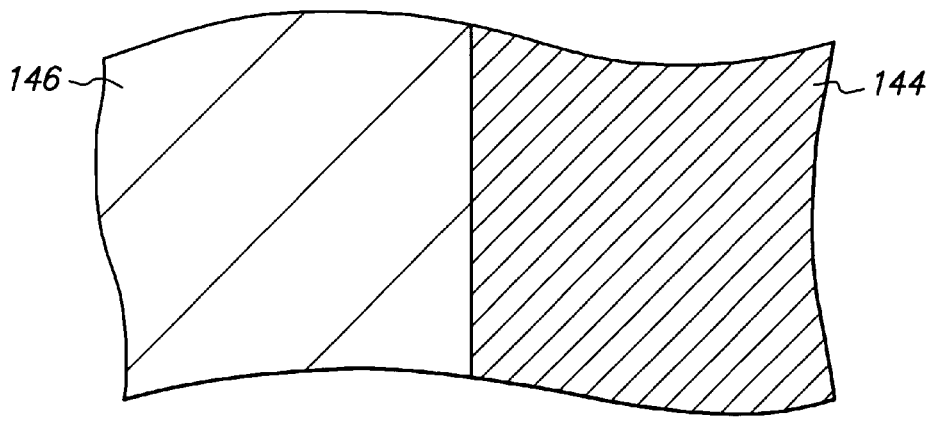
Figure 1J:
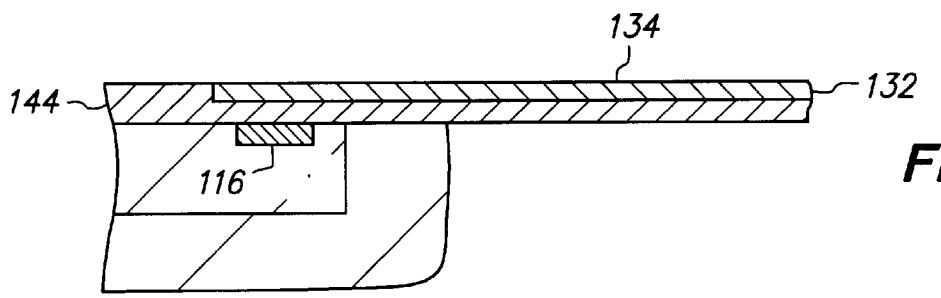
Figure 2J:
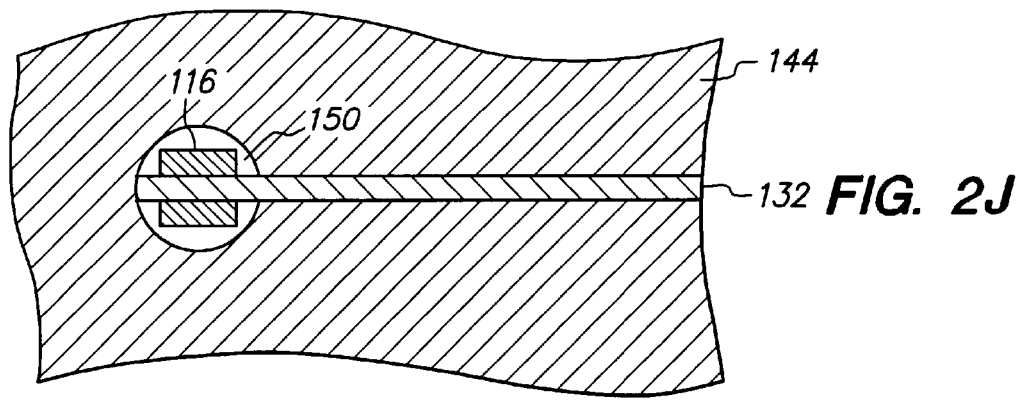
Figure 3J:
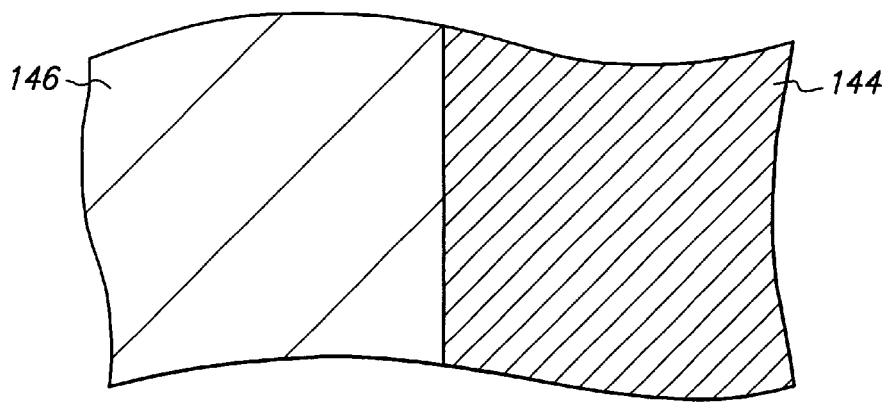
Figure 1K:
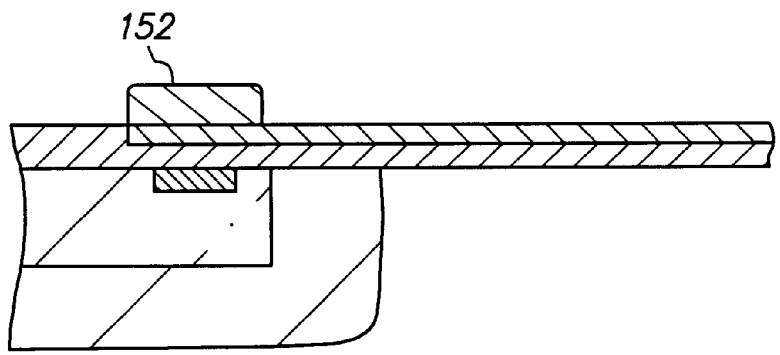
Figure 2K:
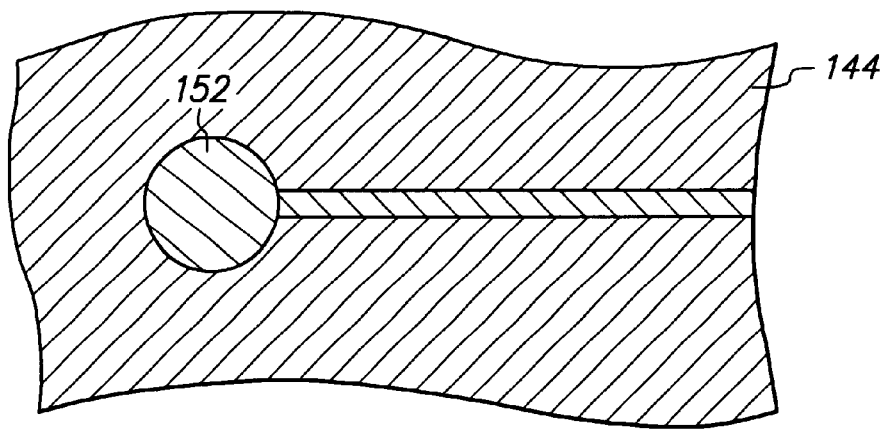
Figure 3K:
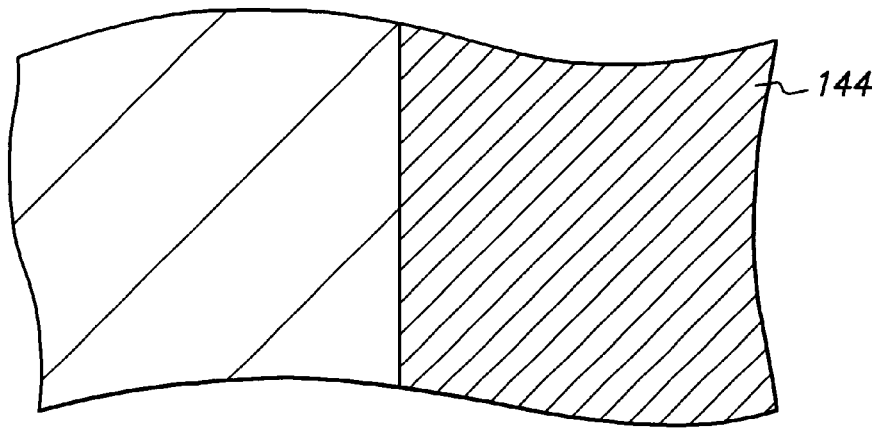
Figure 1L:
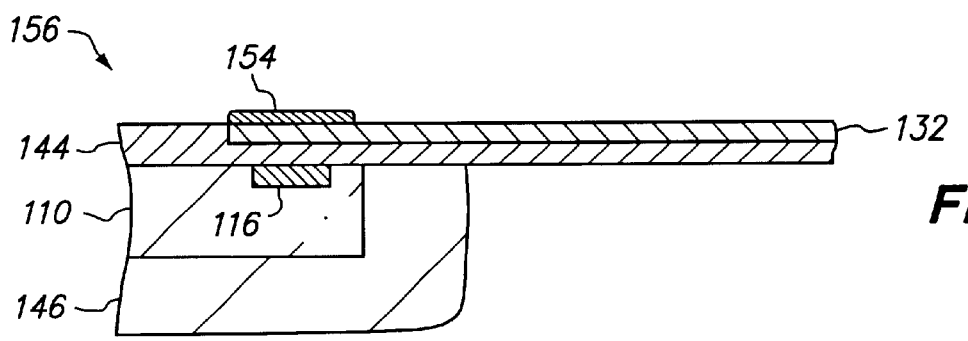
Figure 2L:
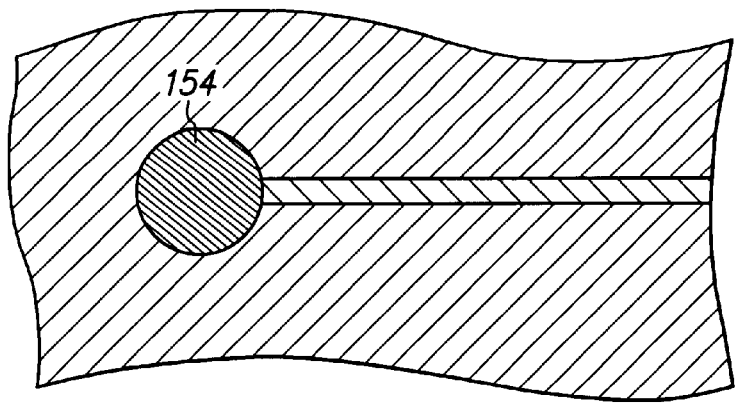
Figure 3L:
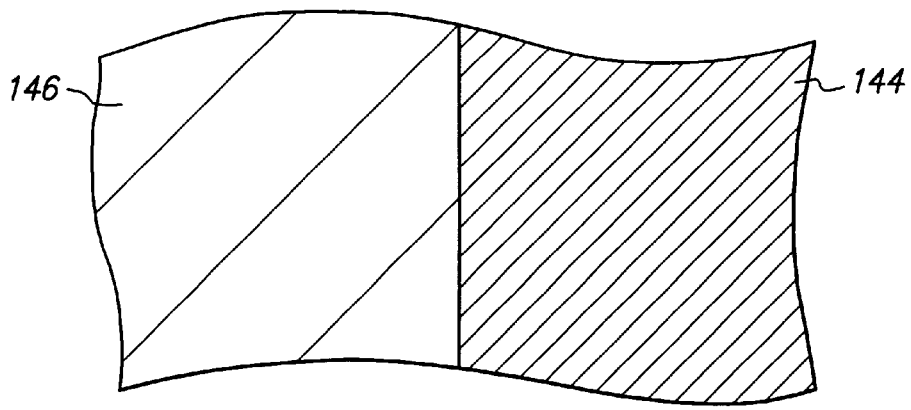
Figure 4A:
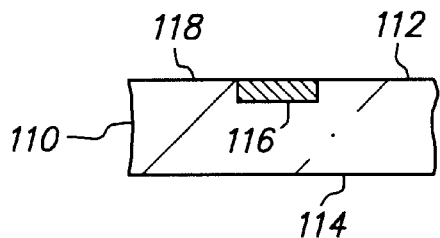
FIGS. 4A–4L are cross-sectional views corresponding to FIGS. 1A–1L, respectively.
Figure 4B:
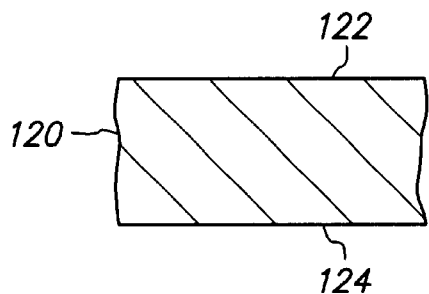
Figure 4C:
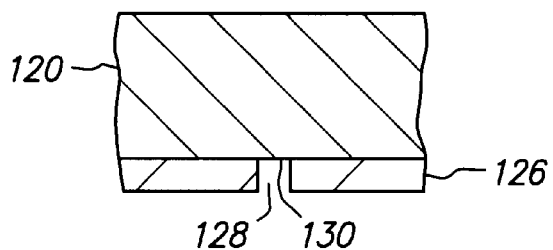
Figure 4D:
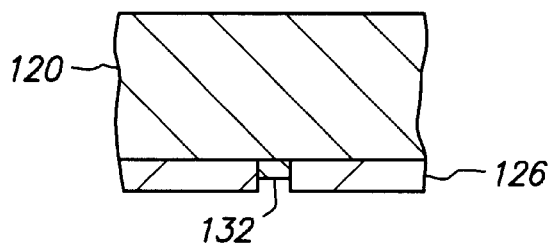
Figure 4E:
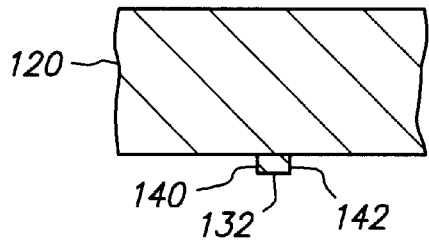
Figure 4F:
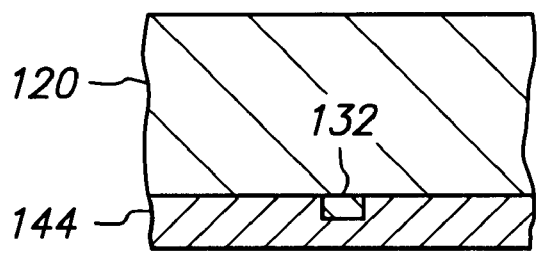
Figure 4G:
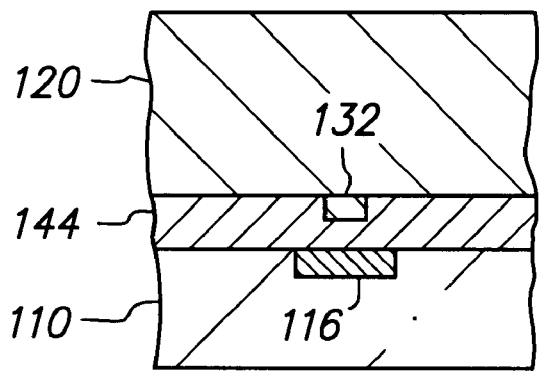
Figure 4H:
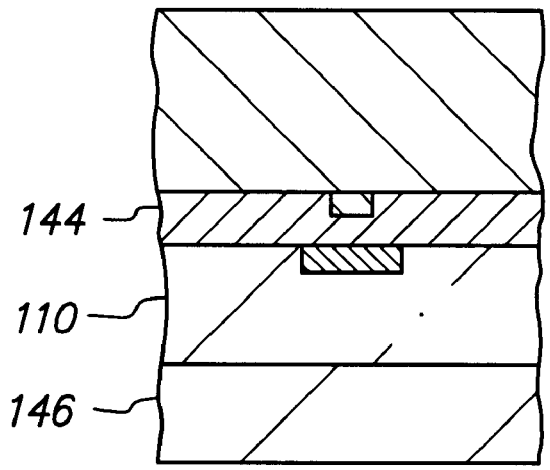
Figure 4I:
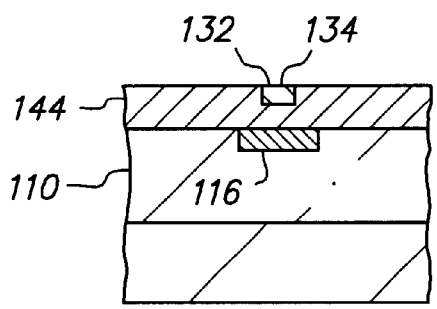
Figure 4J:
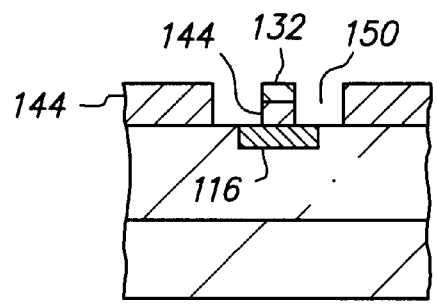
Figure 4K:
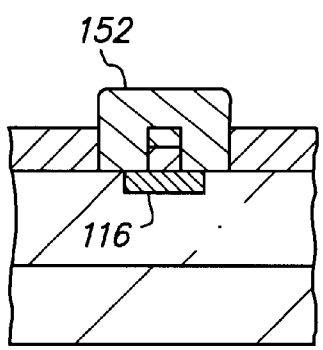
Figure 4L:
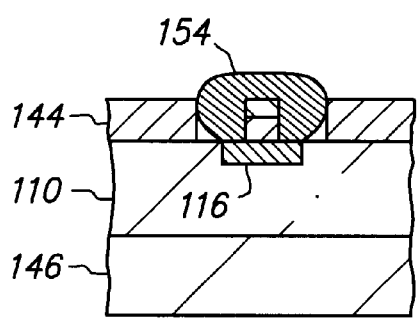

FIGS. 1A–1L, 2A–2L, 3A–3L and 4A–4L are cross-sectional, top, bottom and cross-sectional views, respectively, of a method of connecting a conductive trace to a semiconductor chip in accordance with an embodiment of the present invention. FIGS. 4A–4L are oriented orthogonally with respect to FIGS. 1A–1L and depict FIGS. 1A–1L as viewed from left-to-right.

FIGS. 1A, 2A, 3A and 4A are cross-sectional, top, bottom and cross-sectional views, respectively, of semiconductor chip 110 which is an integrated circuit in which various transistors, circuits, interconnect lines and the like are formed (not shown). Chip 110 includes upper surface 112 and lower surface 114. Upper surface 112 includes conductive pad 116 and passivation layer 118. Pad 116 is substantially aligned with passivation layer 118 so that upper surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid at room temperature for 1 minute and then rinsed in distilled water. Thereafter, pad 116 is rendered wettable for solder reflow. Pad 116 can be rendered wettable for solder reflow by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation or electroplating using a mask which is a relatively complicated process. Alternatively, pad 116 can be rendered wettable to solder reflow by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of NaNO$_3$, as well as tartaric acid to reduce the rate at which the aluminum base dissolves. Thereafter, a nickel surface layer is electrolessly deposited on the zincated aluminum base, and the nickel surface layer wets reflowed solder.

Chip 110 includes many other pads on upper surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and cross-sectional views, respectively, of base 120 which includes top surface 122 and bottom surface 124. Base 120 is a copper foil with a thickness of 100 microns.

FIGS. 1C, 2C, 3C and 4C are cross-sectional, top, bottom and cross-sectional views, respectively, of photoresist layer 126 formed on bottom surface 124 of base 120. Photoresist layer 126 is deposited as a continuous layer and then patterned by selectively applying light through a reticle (not shown), applying a developer solution to remove the photoresist portions rendered soluble by the light, and then hard baking, as is conventional. As a result, photoresist layer 126 contains opening 128 that selectively exposes portion 130 of bottom surface 124. Photoresist layer 126 has a thickness of 10 microns.

FIGS. 1D, 2D, 3D and 4D are cross-sectional, top, bottom and cross-sectional-views, respectively, of conductive trace 132 formed on base 120. Conductive trace 132 includes top surface 134, bottom surface 136, and peripheral sidewalls 140 and 142 therebetween. Top surface 134 faces towards and contacts and is covered by base 120, bottom surface 136 faces away from base 120 and is exposed, and peripheral sidewalls 140 and 142 extend orthogonally from base 120 and are covered by photoresist layer 126. Conductive trace 132 is composed of gold and has a thickness of 5 microns and a width of 20 microns.

Conductive trace 132 is formed by an electroplating operation. Thus, conductive trace 132 is formed additively. Initially, a plating bus (not shown) is connected to base 120, current is applied to the plating bus from an external power source, and base 120 is submerged in an electrolytic gold plating bath such as Technic Orotemp at room temperature. As a result, conductive trace 132 electroplates (or grows) on exposed portion 130 of bottom surface 124 of base 120. The electroplating operation continues until conductive trace 132 has the desired thickness. Thereafter, the structure is removed from the electrolytic bath and rinsed in distilled water to remove contaminants.

FIGS. 1E, 2E, 3E and 4E are cross-sectional, top, bottom and cross-sectional views, respectively, of base 120 and conductive trace 132 after photoresist layer 126 is stripped. At this stage, conductive trace 132 remains attached to base 120, top surface 134 remains covered by base 120, and bottom surface 136 and peripheral sidewalls 140 and 142 are exposed.

FIGS. 1F, 2F, 3F and 4F are cross-sectional, top, bottom and cross-sectional views, respectively, of adhesive 144 formed on base 120 and conductive trace 132. Adhesive 144 is an insulative thermoplastic polyimide film with a glass transition temperature (Tg) of 400° C. Adhesive 144 is applied to portions of bottom surface 124 of base 120 and bottom surface 136 of conductive trace 132 as a liquid resin such as polyamic acid using stencil printing. As a result, the liquid resin flows over peripheral sidewalls 140 and 142. However, the liquid resin does not contact top surface 122. Thereafter, the liquid resin is cured to form adhesive 144 as a polyimide film.

FIGS. 1G, 2G, 3G and 4G are cross-sectional, top, bottom and cross-sectional views, respectively, of chip 110 mechanically attached to conductive trace 132 by adhesive 144. Adhesive 144 is disposed between and contacts upper surface 112 of chip 110 and bottom surface 124 of base 120, and likewise, adhesive 144 is disposed between and contacts upper surface 112 of chip 110 and bottom surface 136 of conductive trace 132. Thus, chip 110 and base 120 do not contact one another, and chip 110 and conductive trace 132 do not contact one another. Preferably, adhesive 144 is sandwiched between upper surface 112 and bottom surface 124, and between upper surface 112 and bottom surface 136, using relatively low pressure while adhesive 144 is heated to its glass transition temperature and becomes molten. In addition, chip 110 and conductive trace 132 are positioned relative to one another so that conductive trace 132 is disposed above and overlaps and is electrically isolated from pad 116. In particular, conductive trace 132 overlaps the center of pad 116 and two opposing peripheral edges of pad 116 (but not the other two opposing peripheral edges of pad 116), and peripheral sidewalls 140 and 142 overlap pad 116. Chip 110 and conductive trace 132 can be aligned using an automated pattern recognition system. Thereafter, adhesive 144 is cooled and solidifies to form a solid adhesive layer that is 10 microns thick between upper surface 112 and bottom surface 136 and mechanically fastens chip 110 to conductive trace 132.

At this stage, conductive trace 132 is covered from above by base 120 and covered from below by adhesive 144, peripheral sidewalls 140 and 142 are covered by adhesive 144, pad 116 is covered from above by adhesive 144, and pad 116 is separated from conductive trace 132 by the thickness of adhesive 144.

FIGS. 1H, 2H, 3H and 4H are cross-sectional, top, bottom and cross-sectional views, respectively, of encapsulant 146 formed on lower surface 114 of chip 110. Preferably, encapsulant 146 is initially an epoxy in paste form that includes an epoxy resin, a curing agent, an accelerator and a filler. The filler is an inert material such as silica (powdered fused quartz) that provides thermal coefficient of expansion matching. The epoxy paste is coated onto the outer edges (one shown) and lower surface 114 of chip 110 as well as the surface of adhesive 144 opposite to conductive trace 132 and outside chip 110. Thereafter, the epoxy paste is cured or hardened at relatively low temperature in the range of 100–250° C., to form a solid adherent protective layer. Encapsulant 146 provides back-side environmental protection such as moisture resistance and particle protection for chip 110 and has a thickness of 100 microns.

FIGS. 1I, 2I, 3I and 4I are cross-sectional, top, bottom and cross-sectional views, respectively, of chip 110, conductive trace 132, adhesive 144 and encapsulant 146 after base 120 is removed. A "front-side" wet chemical etch is applied to top surface 122 of base 120. For instance, the wet chemical etch can be sprayed on top surface 122, or the structure can be dipped in the wet chemical etch since chip 110 is protected by encapsulant 146. The wet chemical etch is highly selective of copper with respect to gold, polyimide and epoxy. Therefore, no appreciable amount of conductive trace 132, adhesive 144 or encapsulant 146 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing base 120 to the wet chemical etch in order to completely remove base 120 without excessively exposing conductive trace 132 to the wet chemical etch can be established through trial and error. Advantageously, since the wet chemical etch is not selective of gold, there is a wide window of acceptable etch times and little or no endpoint concern.

The wet chemical etch completely removes base 120. As a result, top surface 134 of conductive trace 132 is exposed. At this stage, adhesive 144 continues to cover pad 116 and peripheral sidewalls 140 and 142 and provides critical mechanical support for conductive trace 132.

FIGS. 1J, 2J, 3J and 4J are cross-sectional, top, bottom and cross-sectional views, respectively, of opening 150 formed in adhesive 144 that exposes pad 116 and peripheral sidewalls 140 and 142. Opening 150 can be provided by applying a suitable etch that is highly selective of adhesive 144 with respect to pad 116 and conductive trace 132.

In this instance, a selective laser etch is applied. Using projection laser ablation, a metal mask (not shown) is positioned above top surface 134 such that an opening in the metal mask is aligned with pad 116, and a laser is directed to the side of the metal mask opposite top surface 134. Accordingly, the metal mask targets the laser at pad 116. The laser removes a portion of adhesive 144 above pad 116 and outside conductive trace 132. That is, conductive trace 132 shields the underlying adhesive 144 from the laser etch so that the portion of adhesive 144 sandwiched between conductive trace 132 and pad 116 remains intact. However, the portion of adhesive 144 above pad 116 and adjacent to peripheral sidewalls 140 and 142 is removed. The laser also removes a portion of adhesive 144 slightly outside the periphery of pad 116 and outside conductive trace 132. Opening 150 has a diameter of 100 microns and pad 116 (with a length and width of 70 microns) is axially centered within opening 150. Opening 150 is formed in adhesive 144 without damaging pad 116, passivation layer 118 or conductive trace 132.

FIGS. 1K, 2K, 3K and 4K are cross-sectional, top, bottom and cross-sectional views, respectively, of solder paste 152 deposited on pad 116 and conductive trace 132. Solder paste 152 includes finely powdered tin-lead solder particles mixed in a viscous organic resin containing a fluxing agent. Solder paste 152 is deposited into opening 150 using stencil printing. During the stencil printing process, a stencil (not shown) is placed on adhesive 144 and a stencil opening is aligned with opening 150, and then a squeegee (not shown) pushes solder paste 152 along the surface of the stencil opposite adhesive 144, through the stencil opening and into opening 150. Solder paste 152 fills opening 150 and extends above opening 150 by the 30 micron thickness of the stencil. Solder paste 152 is compliant enough at room temperature to conform to virtually any shape. Thus, solder paste 152 contacts and covers the exposed portions of pad 116, top surface 134 and peripheral sidewalls 140 and 142. Since, however, no appreciable amount of bottom surface 136 is exposed, solder paste 152 contacts little or none of bottom surface 136.

FIGS. 1L, 2L, 3L and 4L are cross-sectional, top, bottom and cross-sectional views, respectively, of connection joint 154 formed by solder reflow. Connection joint 154 is formed in opening 150 in adhesive 144 and contacts and electrically connects pad 116 and conductive trace 132. In particular, connection joint 154 contacts and covers portions of top surface 134 and peripheral sidewalls 140 and 142 that overlap pad 116, extends between peripheral sidewalls 140 and 142 and pad 116, and contacts and covers portions of pad 116 outside conductive trace 132. Thus, connection joint 154 provides an electrical connection between pad 116 and conductive trace 132. Connection joint 154 is the only electrical conductor external to chip 110 that contacts pad 116, adhesive 144 and connection joint 154 are the only materials external to chip 110 that contact pad 116, and adhesive 144 and connection joint 154 are the only materials that contact both pad 116 and conductive trace 132.

Connection joint 154 is formed by heating solder paste 152 to a temperature of about 210° C. The heat causes the flux in solder paste 152 to react with and remove oxides from pad 116 and conductive trace 132 and the solder particles in solder paste 152, renders the solder particles in solder paste 152 molten such that they coalesce and wet pad 116 and conductive trace 132, and vaporizes the organic resin in solder paste 152. As a result, solder paste 152 is reduced to roughly one-half its original size and solder reflow occurs. Thereafter, the heat is removed and the molten solder particles cool and solidify into a hardened solder joint that provides connection joint 154. In this manner, the heat transforms non-solidified solder paste 152 into hardened connection joint 154.

Solder paste 152 has a mass that falls within a narrow tolerance such that there is enough solder to wet pad 116 and conductive trace 132 during the reflow operation and form connection joint 154 with a sufficiently large contact area to provide a robust mechanical and electrical connection between pad 116 and conductive trace 132 without providing so much solder as to create bridges or electrical shorts with the adjacent connection joints (not shown).

At this stage, the manufacture of semiconductor chip assembly 156 that includes chip 110, conductive trace 132, adhesive 144, encapsulant 146 and connection joint 154 can be considered complete. Conductive trace 132 is mechanically and electrically coupled to chip 110 by adhesive 144 and connection joint 154, respectively. Conductive trace 132 extends beyond an outer edge of chip 110 and provides horizontal fan-out routing between pad 116 and external circuitry. Advantageously, conductive trace 132 is a single continuous low-profile metal segment.

The semiconductor chip assembly includes other conductive traces embedded in adhesive 144, and only a single conductive trace 132 is shown for convenience of illustration. The conductive traces are each connected to a respective pad on chip 110 by a respective connection joint. Furthermore, the conductive traces each extend across an outer edge of chip 110 near their respective pads to provide horizontal fan-out routing for their respective pads. The conductive traces are electrically isolated from one another by adhesive 144 after base 120 is removed. Advantageously, since base 120 provides a plating bus for forming the conductive traces, and the connection joints are formed by solder paste deposition and solder reflow, there is no plating bus or related circuitry that need be disconnected or severed from chip 110 or the conductive traces after base 120 is removed and the connection joints are formed.

Figure 5:
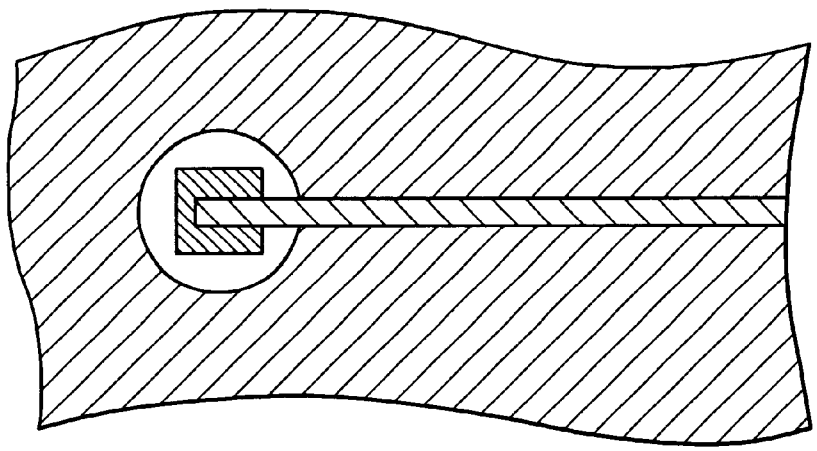
FIGS. 5–8 are top plan views of conductive trace variations in accordance with the present invention.
Figure 6:
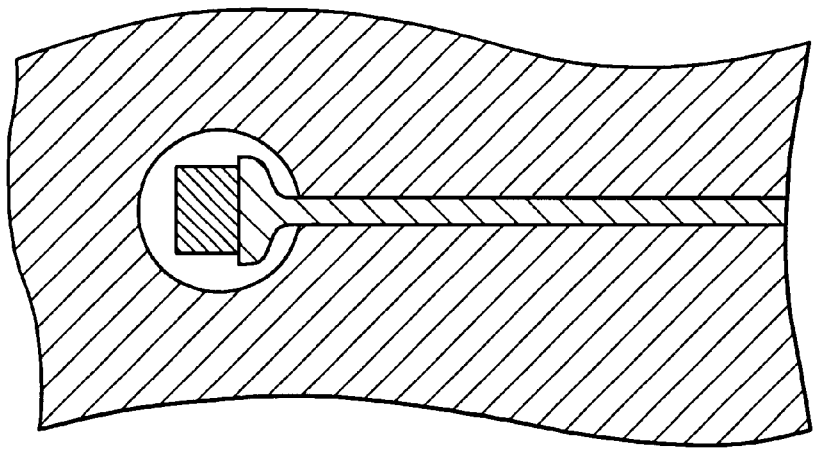
Figure 7:
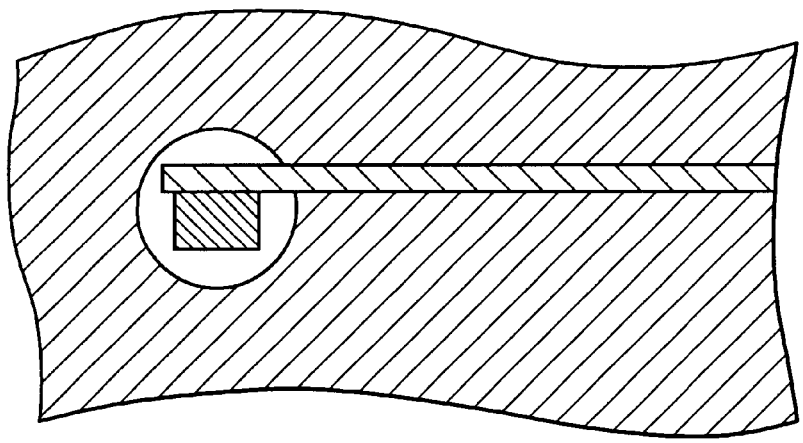
Figure 8:
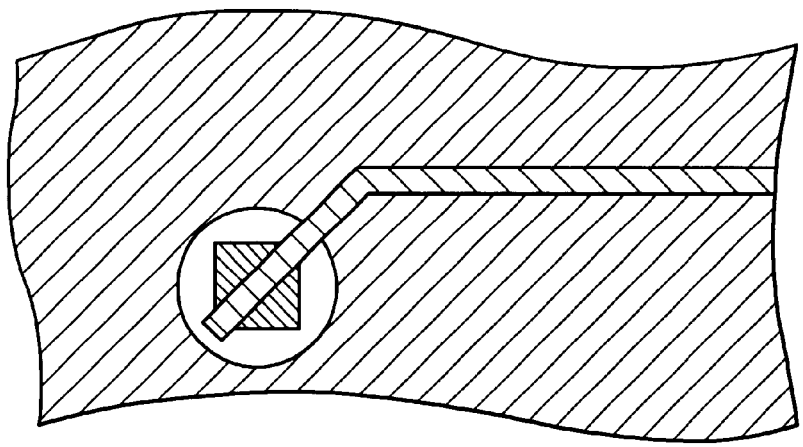

The conductive trace can have various shapes and sizes. The conductive trace can overlap various portions of the pad, such as two opposing peripheral edges and the center of the pad (FIG. 2J), one peripheral edge and the center of the pad (FIG. 5), three peripheral edges but not the center of the pad (FIGS. 6 and 7), or two corners and the center of the pad (FIG. 8).

The conductive trace can be various conductive metals including copper, gold, nickel, aluminum, palladium, tin, combinations thereof, and alloys thereof. The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The conductive trace may function as a signal, power or ground layer depending on the purpose of the associated chip pad. The conductive trace need not necessarily be flat, and a ball, a pad, or a pillar (columnar post) can be deposited on the conductive trace or subtractively formed from a top portion of the conductive trace. A pillar is particularly well-suited for reducing thermal mismatch related stress in the next level assembly. Likewise, the conductive trace can fan-in or fan-out or both, regardless of whether it includes or is connected to a pillar. Moreover, the conductive trace can be disposed proximate to the pad, regardless of whether it overlaps the pad.

The conductive trace can be formed and attached to the chip by a wide variety of lead-on-chip (LOC) and other connection techniques. See, for instance, U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment," which is incorporated by reference.

The pad can have numerous shapes including a flat rectangular shape and a bumped shape. For instance, a bump-shaped pad may extend into the opening in the adhesive. The pad can have a length and width that are larger than, equal to, or smaller than the diameter of the opening in the adhesive. Preferably, the pad and opening have the same or similar size, and essentially all of the pad is directly beneath the opening.

An insulative base can be formed over the conductive trace either before or after the connection joint is formed in order to provide enhanced mechanical strength and protection from unwanted solder reflow during the next level assembly. The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important.

Numerous adhesives can be applied between the chip and the conductive trace. For instance, the adhesive can be applied as a paste, a laminated layer, or a liquid applied by screen-printing, spin-on, or spray-on. If a paste or liquid adhesive is applied, the adhesive may contact the metal base, whereas if a laminated adhesive is applied then no appreciable amount of adhesive may contact the metal base. Thermosetting adhesive liquids and pastes such as epoxies are generally suitable. Likewise, thermoplastic adhesives are also generally suitable. Furthermore, the opening in the adhesive may be formed either before or after mechanically attaching the conductive trace to the chip. For instance, the adhesive can be applied as a liquid or paste (A stage) to the bottom surface of the conductive trace, the adhesive can be partially cured (B stage), a back-side etch can form the opening in the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the opening in the adhesive.

Numerous etches can be applied to form the opening in the adhesive. For instance, the opening in the adhesive can be formed by laser direct write (without a mask) or a blanket plasma etch that removes portions of the adhesive not covered by the conductive trace.

The encapsulant can be deposited on the chip using a wide variety of techniques including printing and transfer molding.

The connection joint can be formed from a wide variety of materials and processes and can have a wide variety of shapes and sizes. Preferably, the connection joint is formed by depositing a non-solidified material on the conductive trace and the pad after forming the opening in the adhesive, and then applying energy to transform the non-solidified material into the connection joint. More preferably, the connection joint is formed by solder reflowing or conductive adhesive curing.

The connection joint formed by solder reflowing involves depositing a non-solidified solder-containing material and then applying energy to reflow the solder and form a hardened solder joint. Suitable solder-containing materials include solder paste, liquid solder and solder particles. The solder can be a tin-lead alloy, although lead-free compositions such as tin-bismuth are becoming increasingly popular due to environmental concerns over lead usage in the electronics industry. Suitable deposition processes include screen printing, stencil printing, meniscus coating, liquid solder jetting and solder particle placement. Heat can be supplied by a convection oven, although other techniques such as infrared (IR) continuous belt reflow, hot nitrogen gas, a laser beam and vapor-phase reflow can be used. The preferred deposition and reflow techniques depend on the solder-containing material employed.

The connection joint formed by conductive adhesive curing involves depositing a non-solidified conductive adhesive and then applying energy to cure the conductive adhesive and form a hardened conductive adhesive joint. Suitable conductive adhesives include (1) a polymer binder (or matrix) and a filler metal powder, and (2) intrinsic conductive polymer. For instance, conductive epoxy paste includes an epoxy binder and silver flakes. Isotropic conductive adhesives in which the electrical conductivity is identical along the three coordinate axes are generally preferred. Suitable deposition processes include screen printing and stencil printing. Heat can be supplied by a convection oven, although other energy sources such as microwaves and UV light can be used. The preferred deposition and curing techniques depend on the conductive adhesive employed.

After the connection joint is formed, further encapsulation can be performed but is generally not necessary. However, it may be desirable to provide further encapsulation to enhance the mechanical strength of the assembly in the event the encapsulant and/or insulative base are particularly thin or omitted.

After the connection joint is formed, a soldering material or solder ball can be deposited over the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted. Likewise, the conductive trace is shown above the chip with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, ball grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The adhesive and/or insulative base protects the chip from handling damage and provides a known dielectric barrier for the conductive trace. The mode of the connection shifts from the initial mechanical coupling to metallurgical coupling to assure sufficient metallurgical bond strength. Furthermore, the conductive trace can be mechanically and metallurgically coupled to the chip without wire bonding, TAB, flip-chip bonding, plating or polishing, although the process is flexible enough to accommodate these techniques if desired. As a result, the assembly of the present invention significantly enhances throughput, yield and performance characteristics compared to conventional packaging techniques.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a semiconductor chip assembly, comprising:

providing a semiconductor chip that includes a conductive pad;

providing a conductive trace with first and second surfaces that are opposite one another and a peripheral sidewall between the surfaces;

disposing an insulative adhesive between the chip and the conductive trace, thereby mechanically attaching the chip to the conductive trace, wherein the first surface faces away from the pad and the peripheral sidewall overlaps the pad; then etching the adhesive, thereby exposing the pad; then depositing a non-solidified material on the first surface, the peripheral sidewall and the pad such that the non-solidified material extends between the peripheral sidewall and the pad; and then transforming the non-solidified material into a hardened connection joint that contacts and electrically connects the conductive trace and the pad.

2. The method of claim 1, wherein the connection joint includes solder.

3. The method of claim 1, wherein the connection joint includes conductive adhesive.

4. The method of claim 1, wherein the adhesive contacts and is sandwiched between the conductive trace and the pad, and the conductive trace and the pad are electrically isolated from one another after etching the adhesive and before depositing the non-solidified material.

5. The method of claim 1, wherein the conductive trace overlaps only one peripheral edge of the pad.

6. The method of claim 1, wherein the conductive trace overlaps only two peripheral edges of the pad, and the two peripheral edges are opposite one another.

7. The method of claim 1, wherein the conductive trace overlaps only three peripheral edges of the pad, and two of the three peripheral edges are opposite one another.

8. The method of claim 1, wherein the connection joint is the only electrical conductor external to the chip that contacts the pad.

9. The method of claim 1, wherein the connection joint and the adhesive are the only materials external to the chip that contact the pad.

10. The method of claim 1, wherein the connection joint and the adhesive are the only materials that contact both the conductive trace and the pad.

11. A method of manufacturing a semiconductor chip assembly, comprising:

providing a semiconductor chip that includes a conductive pad;

providing a conductive trace with first and second surfaces that are opposite one another and a peripheral sidewall between the surfaces;

disposing an insulative adhesive between the chip and the conductive trace, thereby mechanically attaching the chip to the conductive trace, wherein the first surface faces away from the pad, the peripheral sidewall overlaps the pad, the adhesive contacts and is sandwiched between the second surface and the pad, and the conductive trace and the pad are electrically isolated from one another; then etching the adhesive, thereby exposing the pad; then depositing a non-solidified material on the first surface, the peripheral sidewall and the pad such that the non-solidified material extends between the peripheral sidewall and the pad; and then transforming the non-solidified material into a hardened connection joint that contacts and electrically connects the conductive trace and the pad.

12. The method of claim 11, wherein the non-solidified material includes solder, and transforming the non-solidified material reflows the solder.

13. The method of claim 11, wherein the non-solidified material includes conductive adhesive, and transforming the non-solidified material cures the conductive adhesive.

14. The method of claim 11, wherein the conductive trace overlaps a center of the pad.

15. The method of claim 11, wherein the conductive trace does not overlap a center the pad.

16. The method of claim 11, wherein the conductive trace overlaps at least one peripheral edge of the pad but does not overlap each peripheral edge of the pad.

17. The method of claim 11, wherein the conductive trace includes a second peripheral sidewall opposite the peripheral sidewall, the second peripheral sidewall overlaps the pad, and the non-solidified material is deposited on the second peripheral sidewall and extends between the second peripheral sidewall and the pad.

18. The method of claim 11, wherein the connection joint is the only electrical conductor external to the chip that contacts the pad.

19. The method of claim 11, wherein the connection joint and the adhesive are the only materials external to the chip that contact the pad.

20. The method of claim 11, wherein the connection joint and the adhesive are the only materials that contact both the conductive trace and the pad.

21. A method of manufacturing a semiconductor chip assembly, comprising:
providing a semiconductor chip that includes a conductive pad;
providing a conductive trace with first and second surfaces that are opposite one another and a peripheral sidewall between the surfaces;
disposing an insulative adhesive between the chip and the conductive trace, thereby mechanically attaching the chip to the conductive trace, wherein the first surface faces away from the pad, the peripheral sidewall overlaps the pad, the adhesive contacts and is sandwiched between the second surface and the pad, and the conductive trace and the pad are electrically isolated from one another; then
etching the adhesive, thereby exposing the pad; then
depositing a non-solidified material on the first surface, the peripheral sidewall and the pad; and then
applying energy to the non-solidified material, thereby transforming the non-solidified material into a hardened connection joint that electrically connects the conductive trace and the pad, wherein the connection joint contacts the first surface, the peripheral sidewall and the pad and extends between the peripheral sidewall and the pad, the connection joint is the only electrical conductor external to the chip that contacts the pad, the connection joint and the adhesive are the only materials external to the chip that contact the pad, and the connection joint and the adhesive are the only materials that contact both the conductive trace and the pad.

22. The method of claim 21, wherein disposing the adhesive includes contacting the adhesive to the chip and the conductive trace and then curing the adhesive.

23. The method of claim 21, wherein disposing the adhesive includes contacting the adhesive to the chip and the conductive trace and then reflowing the adhesive.

24. The method of claim 21, wherein the adhesive is a thermosetting epoxy.

25. The method of claim 21, wherein the adhesive is a thermoplastic polyimide.

26. The method of claim 21, wherein etching the adhesive includes applying a laser that ablates the adhesive.

27. The method of claim 21, wherein etching the adhesive includes applying a blanket plasma etch.

28. The method of claim 21, wherein the non-solidified material includes solder, and applying the energy reflows the solder.

29. The method of claim 21, wherein the non-solidified material includes conductive adhesive, and applying the energy cures the conductive adhesive.

30. The method of claim 21, wherein the assembly is devoid of wire bonds and TAB leads.

31. A method of manufacturing a semiconductor chip assembly, comprising:
providing a semiconductor chip that includes a conductive pad;
forming an insulative adhesive on the pad;
etching the adhesive, thereby exposing the pad; then
depositing a non-solidified material on a conductive trace and the pad, wherein the conductive trace includes first and second surfaces that are opposite one another and a peripheral sidewall between the surfaces, the first surface faces away from the pad, the peripheral sidewall overlaps the pad, the adhesive is disposed between the second surface and the pad, and the non-solidified material contacts the first surface, the peripheral sidewall and the pad; and then
applying energy to the non-solidified material, thereby transforming the non-solidified material into a hardened connection joint that contacts and electrically connects the conductive trace and the pad, wherein the connection joint is the only electrical conductor that contacts the conductive trace and the pad.

32. The method of claim 31, wherein disposing the adhesive includes contacting the adhesive to the chip and the conductive trace and then curing the adhesive.

33. The method of claim 31, wherein disposing the adhesive includes contacting the adhesive to the chip and the conductive trace and then reflowing the adhesive.

34. The method of claim 31, wherein the adhesive is a thermosetting epoxy.

35. The method of claim 31, wherein the adhesive is a thermoplastic polyimide.

36. The method of claim 31, wherein etching the adhesive includes applying a laser that ablates the adhesive.

37. The method of claim 31, wherein etching the adhesive includes applying a blanket plasma etch.

38. The method of claim 31, wherein the non-solidified material includes solder, and applying the energy reflows the solder.

39. The method of claim 31, wherein the non-solidified material includes conductive adhesive, and applying the energy cures the conductive adhesive.

40. The method of claim 31, wherein the assembly is devoid of wire bonds and TAB leads.

41. A method of manufacturing a semiconductor chip assembly, comprising:
providing a semiconductor chip that includes a conductive pad;
providing a conductive trace with first and second surfaces that are opposite one another and a peripheral sidewall between the surfaces; then
disposing an insulative adhesive between the chip and the conductive trace, thereby mechanically attaching the chip to the conductive trace, wherein the first surface faces away from the pad, and the conductive trace and the pad are electrically isolated from one another; then
etching the adhesive, thereby exposing the peripheral sidewall and the pad; then
depositing a non-solidified material on the first surface, the peripheral sidewall and the pad; and then
applying energy to the non-solidified material, thereby transforming the non-solidified material into a hardened connection joint that electrically connects the conductive trace and the pad, wherein the connection joint contacts the first surface, the peripheral sidewall and the pad.

42. The method of claim 41, wherein the conductive trace includes a second peripheral sidewall opposite the peripheral sidewall, the non-solidified material is deposited on the second peripheral sidewall, and the connection joint contacts the second peripheral sidewall.

43. The method of claim 42, wherein etching the adhesive exposes the second peripheral sidewall.

44. The method of claim 43, wherein the first and second peripheral sidewalls overlap the pad.

45. The method of claim 44, wherein the conductive trace overlaps at least one peripheral edge of the pad but does not overlap each peripheral edge of the pad.

46. The method of claim 43, wherein the connection joint is the only electrical conductor external to the chip that contacts the pad.

47. The method of claim 46, wherein the connection joint and the adhesive are the only materials external to the chip that contact the pad, and the connection joint and the adhesive are the only materials that contact both the conductive trace and the pad.

48. The method of claim 47, wherein the non-solidified material includes solder, and applying the energy reflows the solder.

49. The method of claim 47, wherein the non-solidified material includes conductive adhesive, and applying the energy cures the conductive adhesive.

50. The method of claim 47, wherein the assembly is devoid of wire bonds and TAB leads.

51. A method of manufacturing a semiconductor chip assembly, comprising:

providing a semiconductor chip that includes a conductive pad;

providing a conductive trace with first and second surfaces that are opposite one another and a peripheral sidewall between the surfaces;

disposing an insulative adhesive between the chip and the conductive trace, thereby mechanically attaching the chip to the conductive trace, wherein the first surface faces away from the pad, the peripheral sidewall overlaps the pad, the adhesive contacts and is sandwiched between the second surface and the pad, and the conductive trace and the pad are electrically isolated from one another; then etching the adhesive, thereby exposing the peripheral sidewall and the pad; then depositing a solder-containing material on the first surface, the peripheral sidewall and the pad; and then reflowing the solder-containing material to form a hardened solder joint that electrically connects the conductive trace and the pad, wherein the solder joint contacts the first surface, the peripheral sidewall and the pad and extends between the peripheral sidewall and the pad, the solder joint is the only electrical conductor external to the chip that contacts the pad, the solder joint and the adhesive are the only materials external to the chip that contact the pad, and the solder joint and the adhesive are the only materials that contact both the conductive trace and the pad.

52. The method of claim 51, wherein etching the adhesive includes applying a laser that ablates the adhesive.

53. The method of claim 51, wherein etching the adhesive includes applying a blanket plasma etch.

54. The method of claim 51, wherein depositing the solder-containing material includes screen printing.

55. The method of claim 51, wherein depositing the solder-containing material includes stencil printing.

56. The method of claim 51, wherein depositing the solder-containing material includes solder paste printing.

57. The method of claim 51, wherein depositing the solder-containing material includes liquid solder jetting.

58. The method of claim 51, wherein depositing the solder-containing material includes solder particle placement.

59. The method of claim 51, wherein reflowing the solder-containing material includes applying a laser to the solder-containing material.

60. The method of claim 51, wherein reflowing the solder-containing material includes applying hot nitrogen gas to the solder-containing material.

61. A method of manufacturing a semiconductor chip assembly, comprising:

providing a semiconductor chip that includes a conductive pad;

providing a conductive trace with first and second surfaces that are opposite one another and a peripheral sidewall between the surfaces;

disposing an insulative adhesive between the chip and the conductive trace, thereby mechanically attaching the chip to the conductive trace, wherein the first surface faces away from the pad, the peripheral sidewall overlaps the pad, the insulative adhesive contacts and is sandwiched between the second surface and the pad, and the conductive trace and the pad are electrically isolated from one another; then etching the insulative adhesive, thereby exposing the peripheral sidewall and the pad; then depositing a conductive adhesive on the first surface, the peripheral sidewall and the pad; and then curing the conductive adhesive to form a hardened connection joint that electrically connects the conductive trace and the pad, wherein the connection joint contacts the first surface, the peripheral sidewall and the pad and extends between the peripheral sidewall and the pad, the connection joint is the only electrical conductor external to the chip that contacts the pad, the connection joint and the insulative adhesive are the only materials external to the chip that contact the pad, and the connection joint and the insulative adhesive are the only materials that contact both the conductive trace and the pad.

62. The method of claim 61, wherein etching the insulative adhesive includes applying a laser that ablates the insulative adhesive.

63. The method of claim 61, wherein etching the insulative adhesive includes applying a blanket plasma etch.

64. The method of claim 61, wherein depositing the conductive adhesive includes screen printing.

65. The method of claim 61, wherein depositing the conductive adhesive includes stencil printing.

66. The method of claim 61, wherein the conductive adhesive includes a polymer binder and a filler metal powder.

67. The method of claim 61, wherein the conductive adhesive includes a conductive epoxy paste.

68. The method of claim 61, wherein the conductive adhesive includes a conductive polymer.

69. The method of claim 61, wherein curing the conductive adhesive includes applying heat to the conductive adhesive.

70. The method of claim 61, wherein curing the conductive adhesive includes applying UV light to the conductive adhesive.

* * * * *